(12) United States Patent
Wu et al.

(10) Patent No.: US 9,948,234 B2
(45) Date of Patent: Apr. 17, 2018

(54) SPECTRUM SHAPING VOLTAGE TO CURRENT CONVERTER

(71) Applicant: LATTICE SEMICONDUCTOR CORPORATION, Portland, OR (US)

(72) Inventors: Qiming Wu, Shanghai (CN); Yibin Fu, Shanghai (CN); Yu Shen, Shanghai (CN); Zhi Wu, Shanghai (CN); Kai Lei, Shanghai (CN); Kai Zhou, Shanghai (CN); Kexin Luo, Shanghai (CN); Xiaofeng Wang, Shanghai (CN)

(73) Assignee: Lattice Semiconductor Corporation, Portland, OR (US)

( * ) Notice: Subject to any disclaimer, the term of this patent is extended or adjusted under 35 U.S.C. 154(b) by 318 days.

(21) Appl. No.: 14/440,186

(22) PCT Filed: Jul. 24, 2014

(86) PCT No.: PCT/CN2014/082890
§ 371 (c)(1),
(2) Date: May 1, 2015

(87) PCT Pub. No.: WO2016/011635
PCT Pub. Date: Jan. 28, 2016

(65) Prior Publication Data
US 2016/0248376 A1     Aug. 25, 2016

(51) Int. Cl.
*H03L 7/00* (2006.01)
*H03B 5/04* (2006.01)
*H03L 7/099* (2006.01)
*H03K 3/0231* (2006.01)
*H03L 7/093* (2006.01)

(52) U.S. Cl.
CPC .............. *H03B 5/04* (2013.01); *H03K 3/0231* (2013.01); *H03L 7/00* (2013.01); *H03L 7/093* (2013.01); *H03L 7/099* (2013.01); *H03B 2200/0038* (2013.01)

(58) Field of Classification Search
CPC .......... H03L 7/093; H03L 7/0895; H03L 7/00
USPC ...................................... 331/17, 34, 16, 185
See application file for complete search history.

(56) References Cited

U.S. PATENT DOCUMENTS 6,275,116 B1 * 8/2001 Abugharbieh .......... H03L 7/099
331/16
7,834,709 B2 * 11/2010 Saurabh ................ H03L 7/0995
327/287

* cited by examiner

*Primary Examiner* — Arnold Kinkead
(74) *Attorney, Agent, or Firm* — Fenwick & West LLP

(57) ABSTRACT

A voltage controlled oscillator (VCO) is disclosed. The VCO includes an amplifier that receives a control signal and a feedback signal and generates an amplified output signal based on the difference between the control signal and the feedback signal. The VCO also includes circuitry to generate an oscillating output signal based on the amplifier output signal. Additionally, the VCO includes a feedback amplifier that generates the feedback signal based on the output of the amplifier. The feedback amplifier includes a first resistor connected in parallel with a second resistor, the second resistor having an adjustable resistance.

9 Claims, 4 Drawing Sheets

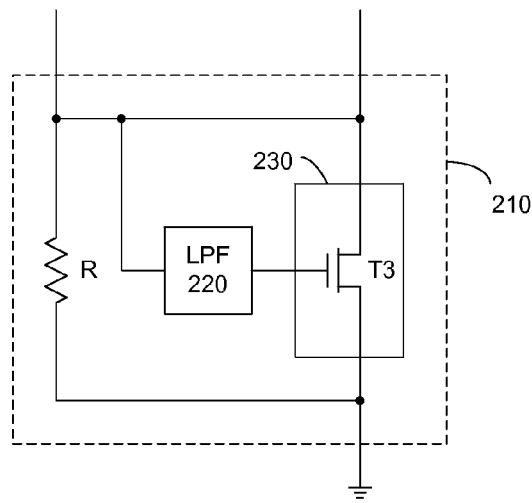
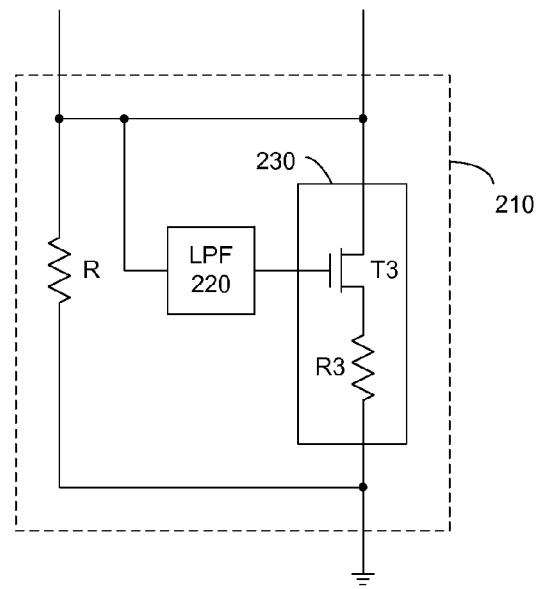
FIG. 3A  FIG. 3B
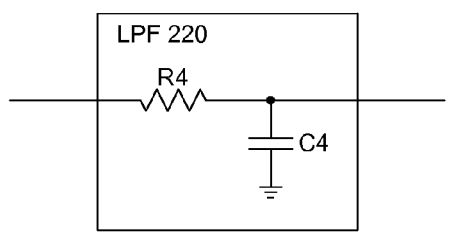
FIG. 4

SPECTRUM SHAPING VOLTAGE TO CURRENT CONVERTER

BACKGROUND OF THE INVENTION

1. Field of the Disclosure

The present disclosure relates to phase locked loops and more specifically to an adaptive voltage to current converter in a voltage control oscillator of a phase locked loop.

2. Description of the Related Art

Phase locked loops (PLLs) are used in a variety of applications from telecommunications to electronic devices. For instance, PLLs are used for demodulating signals, generating periodic signals that have a frequency equal to an integer multiple of a reference periodic signal, in a clock distribution network of a large microprocessor, etc.

PLLs often include large capacitors for stabilizing the output signal and/or filtering high frequency noise that may be added to the input signals. As such, PLLs occupy a large area of an integrated circuit and increase the size of and cost of manufacturing the integrated circuits.

One way to reduce the size of the capacitor used for stabilizing the output signal and/or filtering high frequency noise is by reducing the gain of a voltage controlled oscillator (VCO) used for generating the output signal. Reducing the gain of the voltage controlled oscillator also reduces the frequency range of the PLL. As such, in high frequency applications, it would be beneficial to have a VCO with a large frequency range without using a large capacitor for stabilizing the output signal and/or filtering high frequency noise of the input signals.

SUMMARY

Embodiments relate to a voltage controlled oscillator (VCO). Embodiments also relate to a non-transitory computer readable medium that stores the representation of the voltage controlled oscillator.

The VCO includes an amplifier that receives a control signal and a feedback signal and generates an amplified output signal based on the difference between the control signal and the feedback signal. The VCO also includes circuitry to generate an oscillating output signal based on the amplifier output signal. Additionally, the VCO includes a feedback amplifier that generates the feedback signal based on the output of the amplifier. The feedback amplifier has a load that includes a first resistor connected in parallel with a second resistor having an adjustable resistance. The feedback amplifier may, for example, be a common source amplifier.

In some embodiments, the feedback amplifier also includes a low pass filter (LPF) that generates a resistance control signal based on the feedback signal generated by the feedback amplifier. The resistance control signal generated by the low pass filter controls the adjustable resistance of the second resistor.

In some embodiments, the pole of the low pass filter of the feedback amplifier is smaller than the bandwidth of the phase locked loop.

In some embodiments, the low pass filter includes a third resistor coupled between the input of the low pass filter and the output of the low pass filter and a first capacitor coupled between the output of the low pass filter and ground.

The second resistor having art adjustable resistance may be voltage controlled resistor. In some embodiments, the voltage controlled resistor includes a second transistor having a gate that is connected to the resistance control signal. Alternatively, the voltage controlled resistor includes a switch that opens when the resistance control signal is below a threshold, and a resistor coupled in series with the switch.

In some embodiments, the circuitry for generating the oscillating output signal includes a current mirror that generates an output current based on the amplifier output signal, and a current controlled oscillator (ICO) that generates the oscillating output signal based on the output current. The current mirror may generate an output current that is greater than the current through the load.

BRIEF DESCRIPTION OF THE DRAWINGS

The teachings of the embodiments can be readily understood by considering the following detailed description in conjunction with the accompanying drawings.

FIG. 3A is a circuit diagram of a feedback network in the voltage control oscillator, according to one embodiment.

FIG. 3B is a circuit diagram of a feedback network with a degenerated transistor in the voltage control oscillator, according to one embodiment.

FIG. 4 is a circuit diagram of a low pass filter, according to one embodiment.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Figure 1:
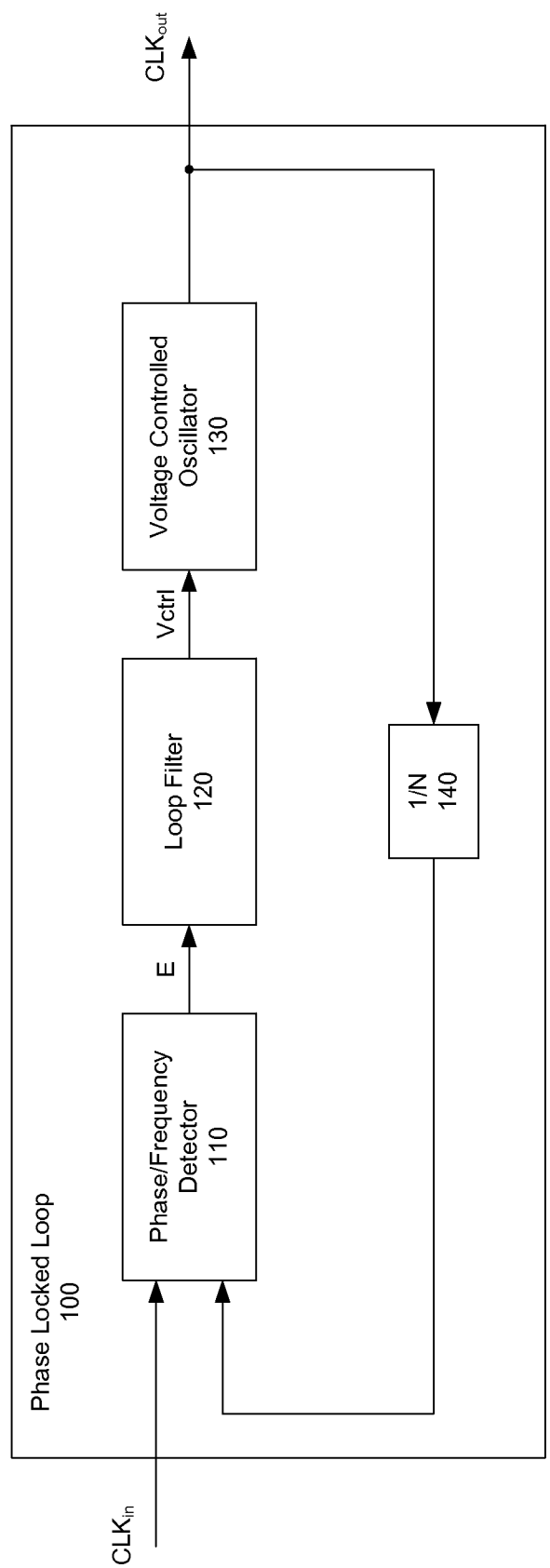
FIG. 1 is a block diagram of a phase locked loop, according to one embodiment.

FIG. 1 is a block diagram of a phase locked loop (PLL), according to one embodiment. The PLL 100 receives as an input an input clock ($CLK_{in}$) and outputs an output clock ($CLK_{out}$). PLL 100 includes a phase/frequency detector (PFD) 110, a loop filter 120, a voltage controlled oscillator (VCO) 130 and a frequency divider (1/N) 140.

PFD 110 compares the phase the input clock ($CLK_{in}$) and the output clock ($CLK_{out}$). PFD 110 determines a phase difference between $CLK_{in}$ and $CLK_{out}$ and generates a phase error E. The phrase error signal E indicates the phase difference between $CLK_{in}$ and $CLK_{out}$.

In some embodiments, the frequency of the output clock ($CLK_{out}$) is divided using a frequency divider (1/N) 140, before the phase of the output clock ($CLK_{out}$) is compared to the phase of the input clock ($CLK_{in}$). The frequency divider 140 may divide the frequency of the output clock ($CLK_{out}$) using a counter. For instance, the frequency divider (1/N) 140 may generate a signal every N cycles. That is, the frequency of the output clock ($CLK_{out}$) is divided by N. In some embodiment, N is a power of 2 (e.g., 2, 4, 8, 16, 32). In other embodiment, the frequency of the output clock ($CLK_{out}$) may be divided by any arbitrary integer value.

The phase error E is then input to a loop filter 120. The loop filter 120 filters the high frequency components of the phase error and generates a control voltage ($V_{ctrl}$). The cutoff frequency of the loop filter 120 determines the stability of the PLL. The loop filter 120 determines how the PLL responds to effects such as jitter in the input clock $CLK_{in}$. For instance, if $CLK_{in}$ jitters, it may be advantageous not to propagate the jitter in $CLK_{in}$ to the output of the PLL. Typically, loop filters of a PLL have a cutoff frequency that is smaller than one tenth of the frequency of $CLK_{in}$. The cutoff frequency of the loop filter 120 is controlled by a capacitance of a capacitor used in the loop filter 120. Capacitors with large capacitance values occupy a large area in PLLs and, as such, may increase the cost of manufacturing the integrated circuits (ICs) that include PLLs. For instance, a capacitor may occupy 90% of the area of a loop filter, and the loop filter may occupy around 50% of the area of a PLL. In one embodiment the loop filter 120 is a low pass filter.

The voltage control oscillator (VCO) 130 receives the control voltage ($V_{ctrl}$) from the loop filter 120 and produces a periodic output signal based on the value of $V_{ctrl}$.

Figure 2A:
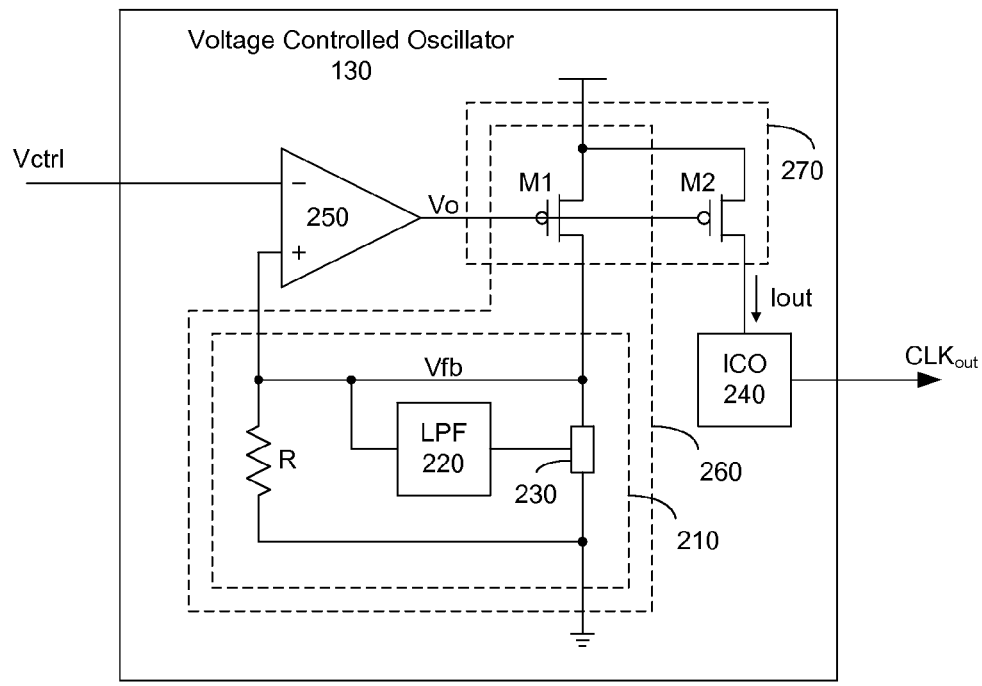
FIG. 2A is a circuit diagram of a voltage controlled oscillator used in a phase locked loop, according to one embodiment.
Figure 2B:
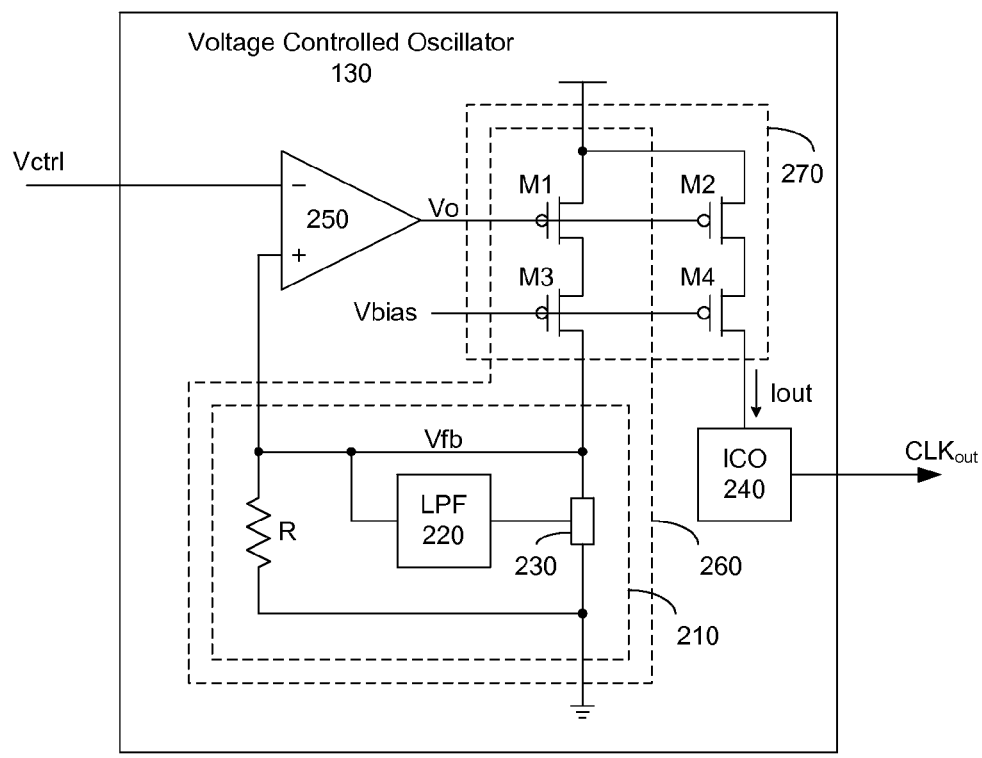
FIG. 2B is a circuit diagram of a voltage controlled oscillator with cascoded transistors, according to one embodiment.

FIG. 2A and FIG. 2B illustrate circuit diagrams of a VCO, according to different embodiments. The VCO of FIGS. 2A and 2B include an operational amplifier (op-amp) 250, a feedback amplifier 260, a current mirror 270, and a current controlled oscillator 240.

The op-amp 250 receives as an input the control voltage signal ($V_{ctrl}$) generated by the loop filter 120 and the output voltage signal ($V_{fb}$) of the feedback amplifier 260 and generates an amplifier output signal (Vo) based on the difference between $V_{ctrl}$ and $V_{fb}$. For example, the output (Vo) of the op-amp 250 may be:

$$Vo = A(V_{fb} - V_{ctrl}) \quad (1)$$

The output of the op-amp 250 is provided as an input to the feedback amplifier 260. The feedback amplifier receives the output voltage signal (Vo) of the op-amp 250 and generates the feedback voltage signal ($V_{fb}$).

The feedback amplifier 260 of the VCO 130 of FIG. 2A is a common source amplifier. The common source amplifier 260 includes a transistor M1 and a load 210. Transistor M1 receives as an input the output voltage signal (Vo) of op-amp 250 and generates a feedback voltage signal ($V_{fb}$) proportional to the value of Vo. The load 210 is coupled to the drain of transistor M1.

The load 210 is formed from a resistive network that includes a resistor R in parallel with a voltage controlled resistor 230. Resistor R has a fixed resistance. The voltage controlled resistor 230 has an adjustable resistance that is controlled by a low pass filter (LPF) 220. Generally, as the voltage of the amplifier output signal (Vo) decreases, the resistance of the voltage controlled resistor 230 also decreases.

The gain ($\beta$) of the feedback amplifier of FIG. 2A may, for example, be:

$$|\beta| = \left|\frac{V_{fb}}{Vo}\right| = gmR_D \quad (2)$$

where gm is the transconductance of transistor M1 and $R_D$ is the resistance of the load 210. The resistance ($R_D$) of the load 210 is given by:

$$\frac{1}{R_D} = \frac{1}{R} + \frac{1}{R_{230}} \quad (3)$$

where $R_{230}$ is the resistance of the voltage controlled rolled resistor 230. In some embodiments, as seen in FIG. 3A, a transistor T3 is used as the voltage controlled resistor. In this embodiment, $R_D$ would be given by:

$$\frac{1}{R_D} = \frac{1}{R} + \frac{1}{\prod_{i=0}^{N}\left(1 + \frac{s}{\omega_{pi}}\right)\frac{1}{gm_{T3}}} \quad (4)$$

where $gm_{T3}$ is the transconductance of the transistor used as the voltage controlled resistor 230 and $\omega_{pi}$ is the pole of the LPF 220. As a result, the amplifier output voltage (Vo) would be equal to:

$$Vo = \frac{V_{fb}}{\beta} = \frac{V_{fb}}{gmR} + \frac{V_{fb}}{\prod_{i=0}^{N}\left(1 + \frac{s}{\omega_{pi}}\right)\frac{gm}{gm_{T3}}} \quad (5)$$

The current mirror 270 generates an output current ($I_{out}$) based on the value of the output voltage (Vo) of the op-amp 250. The current mirror 270 includes transistor M1 and transistor M2. Transistor M2 may be N times larger than transistor M1 so that the output current (Io) is N times larger than the current flowing through the load 210. In other words, the transconductance of M2 is N times larger than the transconductance of M1. The value of $I_{out}$ may be given by:

$$I_{out} = gm_{M2}Vo = NgmVo = \left(\frac{V_{fb}}{R} + \frac{gm_{T3}V_{fb}}{\prod_{i=0}^{N}\left(1 + \frac{s}{\omega_{pi}}\right)}\right) \times N \quad (6)$$

where $gm_{M2}$ is the transconductance of transistor M2. At equilibrium, if the gain A of op-amp 250 is very large, $V_{fb}$ would be substantially equal to $V_{ctrl}$. Thus, $I_{out}$ may be given by:

$$I_{out} = gm_{M2}Vo = NgmVo = \left(\frac{V_{ctrl}}{R} + \frac{gm_{T3}V_{ctrl}}{\prod_{i=0}^{N}\left(1 + \frac{s}{\omega_{pi}}\right)}\right) \times N \quad (7)$$

In some embodiments, the LPF 220 is designed to have poles much smaller than the PLL loop bandwidth. The PLL loop bandwidth is a measure of the PLL's ability to track input clock and jitter. Higher PLL bandwidth means the PLL can adjust the output frequency faster. A LPF 220 with poles much smaller than the PLL loop bandwidth reduces the magnitude of the output current ($I_{out}$) generated based on the high frequency components of the output voltage (Vo). In this embodiment, the high frequency components of $V_{ctrl}$ are filtered out by LPF 220 and $I_{out}$ is given by:

$$I_{out} = \frac{V_{ctrl}}{R} \times N \tag{8}$$

At low frequencies, the voltage controlled resistor 230 is turned on. When the voltage controlled resistor 230 turns on, the value of $R_D$ decreases, increasing the magnitude of the output current $I_{out}$. For instance, at very low frequencies (e.g., near DC frequencies) the magnitude of $I_{out}$ is $$I_{out} = \left(\frac{V_{ctrl}}{R} + V_{ctrl} gm_{T3}\right) \times N \tag{9}$$

FIGS. 3A and 3B illustrate different embodiments of the voltage controlled resistor 230. In the embodiment of FIG. 3A, the voltage controlled resistor 230 is a transistor T3. In this embodiment, when transistor T3 is on, the resistance of the voltage controlled resistor is equal to $$R_{230} = \frac{1}{gm_{T3}} \tag{10}$$

In the embodiment of FIG. 3B, the voltage controlled resistor 230 includes transistor T3 and a resistor R3. As such, when transistor T3 is on, the resistance of the voltage controlled resistor is equal to:

$$R_{230} = \frac{1}{gm_{T1}} + R3 \tag{11}$$

In other embodiments, the voltage controlled resistor 230 includes a switch controlled by the output of LPF 220 and resistor R3 in series with the switch. The switch of the voltage controlled resistor opens when the output of the LPF 220 is below a threshold ($V_{th230}$) and closes when the output of the LPF 220 is above the threshold ($V_{th230}$). As such, the resistance of the voltage controlled is infinite (i.e., open circuit) when the output of the LPF 220 is below $V_{th230}$ and R3 when the output of the LPF 220 is above $V_{th230}$.

FIG. 4 illustrates an embodiment of the low pass filter (LPF) 220. The LPF 220 of FIG. 2 includes a resistor R4 and a capacitor C4. In some embodiments, the capacitor C4 is a metal oxide semiconductor (MOS) capacitor. In other embodiments, capacitor C4 is a reverse biased diode. In yet other embodiments, capacitor C4 is a MOSFET with the source and the drain connected to each other.

The LPF 220 of FIG. 4 has one pole. A LPF with any number of poles may be used. For instance, a low pass filter with two resistors and two capacitors may be used to control the voltage controlled resistor 230. Increasing the number of poles of the LPF 220 increase the effectiveness of the LPF from turning off at larger frequencies, but also substantially increases the area occupied by the LPF 220.

The current ($I_{out}$) generated by the current mirror 270 is fed to the current controlled oscillator (ICO) 240. The ICO 240 then generates a periodic oscillating clock signal ($CLK_{out}$) having a frequency that is proportional to the value of $I_{out}$. Thus the gain of the VCO 130 will be given by:

$$KVCO = \frac{I_{out}}{V_{ctrl}} \times KICO \tag{12}$$

where KVCO is the frequency gain of the VCO 130, and KICO is the frequency gain of the ICO 240. That is, KVCO describes the frequency of the output signal of the VCO 130 as a function of the input voltage of the VCO, and KICO describes the frequency of the output signal of the ICO 240 as a function of the input current of the ICO 240.

FIG. 2B illustrates a different embodiment of the VCO 130. The VCO 130 of FIG. 2B uses a cascoded transistor M3 to increase the gain of the feedback amplifier 260. Similarly, a cascoded current mirror transistor M4 is used in the current mirror 270 to match the configuration of the transistors of the feedback amplifier 260. To bias transistors M3 and M4, a voltage source Vbias may be provided to VCO 130. Alternatively, additional circuitry may be added to provide the desired bias for transistors M3 and M4. Using a cascoded feedback amplifier 260 and a cascoded current mirror 270 advantageously increases the power supply rejection ratio of the VCO. In other embodiments, different configurations may be used for the feedback amplifier 260. For instance, source degeneration may be used in the feedback amplifier 260 of VCO 130.

Figure 5:
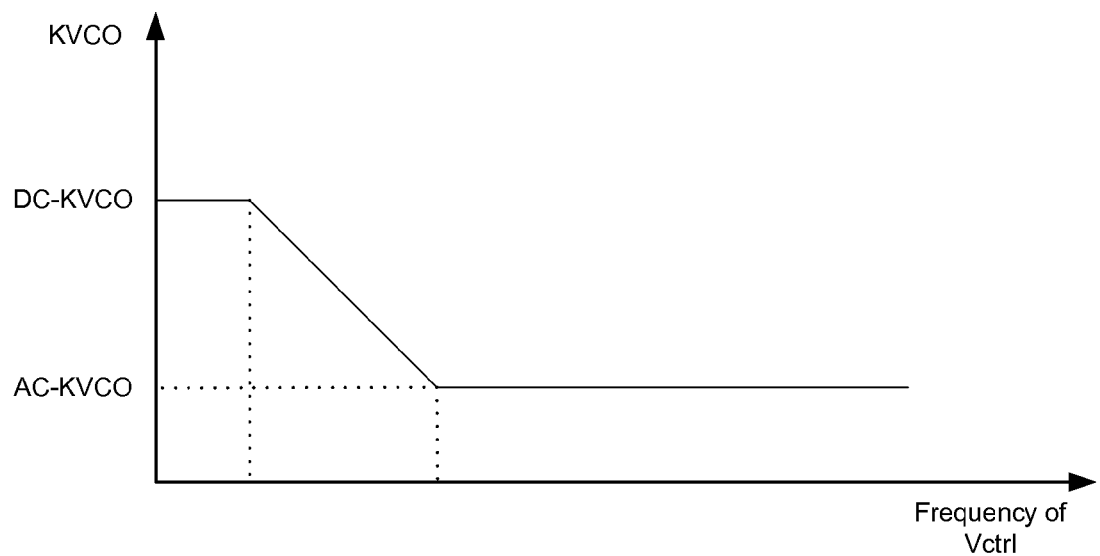
FIG. 5 is a graph illustrating the gain of the voltage controlled oscillator (KVCO) as a function of the frequency of the VCO control voltage (Vctrl), according to one embodiment.

FIG. 5 is a graph illustrating the gain of the voltage controlled oscillator (KVCO) as a function of $V_{ctrl}$, according to one embodiment. At low frequencies, the LPF 220 turns on the voltage controlled resistor 230 and the gain of the voltage controlled oscillator (DC-KVCO) is $$DC\text{-}KVCO = \left(\frac{1}{R} + gm_{T3}\right) N \times KICO \tag{13}$$

At higher frequencies, the LPF 220 turns off the voltage controlled resistor 230 and the gain of the voltage controlled oscillator (AC-KVCO) is $$AC\text{-}KVCO = \frac{N}{R} \times KICO \tag{14}$$

A large DC-KVCO allows the PLL to have a large frequency range, while a low AC-KVCO prevents fluctuations of the input clock ($CLK_{in}$) from propagating to the output clock ($CLK_{out}$). For instance, a small AC-KVCO may prevent jitter in the input clock ($CLK_{in}$) from propagating to the output clock ($CLK_{out}$).

As such, the effect of fluctuations of the input clock ($CLK_{in}$) propagating to the output clock ($CLK_{out}$) can be adjusted by selecting different values of resistor R. In addition, the frequency range of PLL may be adjusted by adjusting the value of the voltage controlled resistor 230 (e.g., by adjusting the transconductance of transistor T3). For instance, a transistor with a larger transconductance may be used to increase the gain of the VCO 130 and increase the frequency range of the PLL 100. In some embodiments, the value of resistor R may further be selected to increase the stability and the phase margin of the feedback loop.

Since the VCO 130 itself can reduce the influence of fluctuations of the input clock ($CLK_{in}$) from propagating to the output clock ($CLK_{out}$), a smaller loop filter 120 may be used for PLL 100.

Figure 6:
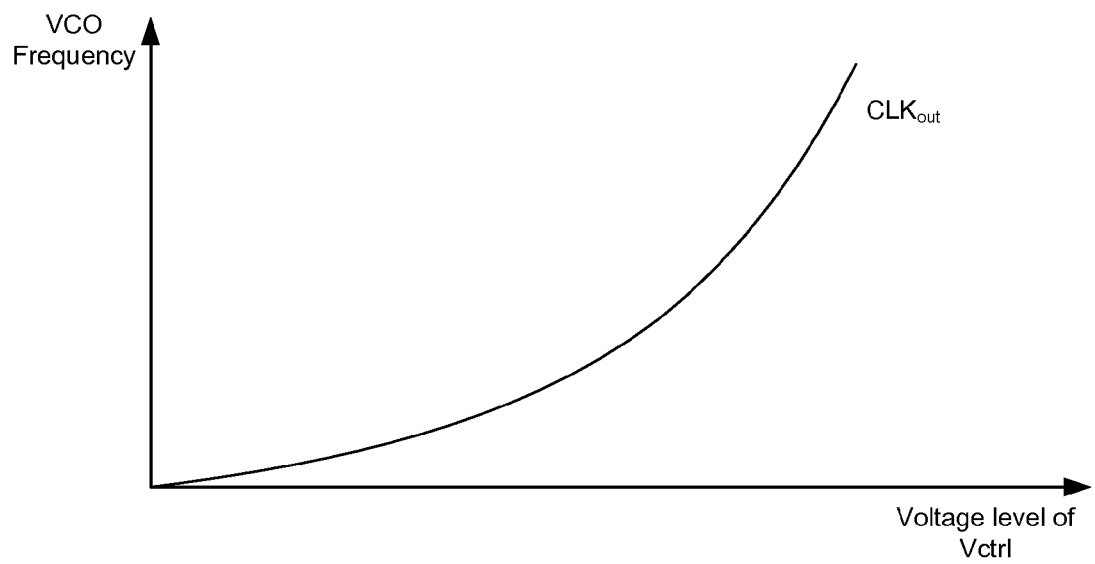
FIG. 6 is a graph illustrating the frequency of the voltage controlled oscillator as a function of Vctrl, according to one embodiment.

FIG. 6 is a graph illustrating the frequency of the voltage controlled oscillator as a function of the control voltage ($V_{ctrl}$). The graph of FIG. 6 corresponds to the case when Vctrl is constant (e.g., a DC value). That is, the graph of FIG. 6 illustrates the effect of the PLL for the DC components of $V_{ctrl}$. As illustrated in FIG. 6, as the voltage level of Vctrl increases, the frequency of the periodic output clock ($CLK_{out}$) also increases. In some embodiments, the relationship between the frequency of the periodic output clock ($CLK_{out}$) and $V_{ctrl}$ is not linear. For instance, the relationship between the VCO frequency and $V_{ctrl}$ is polynomial (e.g., quadratic). Using equation (9), it can be derived that the frequency of the periodic output clock ($CLK_{out}$) is given by $$VCO_{freq} = \left(\frac{V_{ctrl}}{R} + V_{ctrl}gm_{T3}\right) \times N \times KICO \quad (15)$$

and $$gm_{T3} = \mu_n C_{ox} \frac{W}{L}(V_{ctrl} - V_{th}) \quad (16)$$

where $V_{th}$ is the threshold voltage of transistor T3, $\mu_n$ is the mobility of an electron, $c_{ox}$ is the gate oxide capacitance of transistor T3, W is the width of transistor T3, and L is the channel length of transistor T3. Thus, using equations (15) and (16), it can be seen that the frequency of the periodic output clock ($CLK_{out}$) may have a quadratic relationship with respect to $V_{ctrl}$. In another embodiment, the relationship between the VCO frequency and $V_{ctrl}$ is exponential.

In one embodiment, a representation of the PLL 100 or any of its individual components may be stored as data in a non-transitory computer-readable medium (e.g. hard disk drive, flash drive, optical drive). These representations may be behavioral level, register transfer level, logic component level, transistor level and layout geometry-level descriptions.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without deporting from the spirit and scope as defined in the appended claims.

What is claimed is:

1. A voltage controlled oscillator comprising:
   an amplifier to receive a control signal and a feedback signal and to generate an amplifier output signal indicative of a difference between the control signal and the feedback signal;
   circuitry to generate an oscillating output signal based on the amplifier output signal;
   a feedback amplifier to generate the feedback signal based on the amplifier output signal, the feedback amplifier having a load that includes a first resistor and a second resistor connected in parallel to the first resistor, the second resistor having an adjustable resistance; and
   a low pass filter to generate a resistance control signal based on the feedback signal, wherein the adjustable resistance of the second resistor is controlled based on the resistance control signal.

2. The voltage controlled oscillator of claim 1, wherein the voltage controlled oscillator is for a phase lock loop (PLL), and a pole of the low pass filter is smaller than a PLL loop bandwidth.

3. The voltage controlled oscillator of claim 1, wherein the low pass filter comprises:
   a third resistor coupled between an input of the low pass filter and an output of the low pass filter; and
   a first capacitor coupled between the output of the low pass filter and ground.

4. The voltage controlled oscillator of claim 1, wherein the second resistor is a voltage controlled resistor.

5. The voltage controlled oscillator of claim 4, wherein the voltage controlled resistor comprises a second transistor having a gate that is connected to the resistance control signal.

6. The voltage controlled oscillator of claim 4, wherein the voltage controlled resistor comprises a switch and a resistor coupled in series with the switch, and wherein the switch opens when the resistance control signal is below a threshold.

7. The voltage controlled oscillator of claim 1, wherein the circuitry comprises:
   a current mirror to generate an output current based on the amplifier output signal; and
   a current controlled oscillator to generate an oscillating output signal based on the output current.

8. The voltage controlled oscillator of claim 7, wherein the current mirror generates the output current to be greater than a current through the load.

9. The voltage controlled oscillator of claim 1, wherein the feedback amplifier is a common source amplifier.

\* \* \* \* \*